(12) United States Patent
Saiki

(10) Patent No.: US 7,164,085 B2
(45) Date of Patent: Jan. 16, 2007

(54) MULTILAYER WIRING BOARD INCLUDING STACKED VIA STRUCTURE

(75) Inventor: Hajime Saiki, Aichi (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 105 days.

(21) Appl. No.: 10/846,923

(22) Filed: May 17, 2004

(65) Prior Publication Data

US 2005/0155791 A1 Jul. 21, 2005

(30) Foreign Application Priority Data

May 16, 2003 (JP) ............................. 2003-139544
Mar. 4, 2004 (JP) ............................. 2004-060910

(51) Int. Cl.
*H01R 12/04* (2006.01)

(52) U.S. Cl. ...................................... 174/261; 174/262

(58) Field of Classification Search ................ 174/261, 174/262
See application file for complete search history.

(56) References Cited

U.S. PATENT DOCUMENTS 5,239,448 A * 8/1993 Perkins et al. .............. 361/764
6,534,723 B1 * 3/2003 Asai et al. .................. 174/255
6,591,491 B1 * 7/2003 Fujii et al. ................... 29/830
6,646,337 B1 * 11/2003 Iijima et al. ................ 257/700
6,768,064 B1 * 7/2004 Higuchi et al. ............. 174/267
2003/0178229 A1 * 9/2003 Toyoda et al. .............. 174/261

FOREIGN PATENT DOCUMENTS

| JP | 2000-101243 | 4/2000 |
|---|---|---|
| JP | 2000-323843 | 11/2000 |
| JP | 2003-23251 | 1/2003 |
| JP | 2003-23252 | 1/2003 |
| JP | 2003-23253 | 1/2003 |

* cited by examiner

*Primary Examiner*—Dean A. Reichard
*Assistant Examiner*—Ivan Carpio
(74) *Attorney, Agent, or Firm*—Stites & Harbison PLLC; Ross F. Hunt, Jr.

(57) ABSTRACT

A multilayer wiring board includes a substrate, a first planar conductor layer, a second planar conductor layer, resin dielectric layers, filled vias, and stacked via structures. Each of the stacked via structures is disposed in the resin dielectric layers and is configured such that the filled vias are stacked substantially coaxially and are mutually connected together. A first end of the stacked via structure is connected directly to either the first planar conductor layer or the second planar conductor layer. A second end of the stacked via structure is unconnected, directly, to both the first planar conductor layer and the second planar conductor layer.

3 Claims, 6 Drawing Sheets

FIG. 7
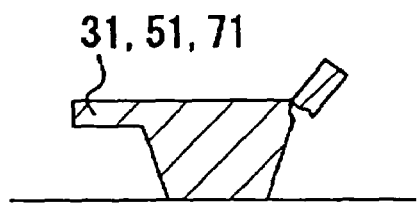
FIG. 8
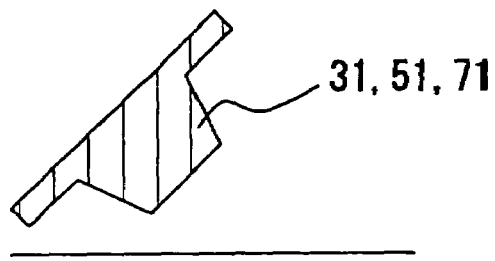
FIG. 9
| | RESULTS OF VIA PEELING TEST | | |
|---|---|---|---|
| | THIRD FILLED VIA | SECOND FILLED VIA | FIRST FILLED VIA |
| EXAMPLE | 0/1600 | 0/1600 | 0/1600 |
| COMPARATIVE EXAMPLE | 0/1600 | 14/1600 | 29/1600 |

MULTILAYER WIRING BOARD INCLUDING STACKED VIA STRUCTURE

BACKGROUND OF THE INVENTION

1. Field of the Invention

The present invention relates to a multilayer wiring board, and more particularly, to a multilayer wiring board incorporating a stacked via structure.

2. Description of the Related Art

A conventional, well-known type of multilayer wiring board is configured such that conductor patterns of different layers are connected through a via formed in a resin dielectric layer. In recent years, in order to reduce the size of a wiring board, for example, there have been proposed various kinds of multilayer wiring boards having a stacked via structure in which a plurality of filled vias are stacked substantially coaxially in a resin dielectric layer. (Reference is made, for example, to Japanese Patent Application Laid-Open (kokai) No. 2000-101243 (e.g., FIG. 8).)

Such conventional multilayer wiring boards have exhibited a tendency toward cracking in a stacked via structure of a particular type, resulting in impaired reliability. The present inventor has extensively studied the problem and found that stacked via structures suffering cracking had the following trait in common: the opposite ends of a stacked via structure are connected directly to corresponding planar conductor layers (so-called solid patterns) which are located in a resin dielectric layer and on an outer surface of the resin dielectric layer, and which have a relatively large area. This study also revealed that as the thickness of a resin dielectric layer increased with the number of stacked filled vias, the occurrence of cracking tended to become more noticeable.

SUMMARY OF THE INVENTION

In view of the foregoing, one object of the present invention is to provide a multilayer wiring board including a filled via structure that is not prone to cracking and thus exhibits excellent reliability.

As indicated above, the present inventor conducted extensive studies in an attempt to solve the aforementioned problem, and as a result of these studies, has derived the following findings. A stacked via structure susceptible to cracking is characterized by (i) being supported at its opposite ends by corresponding planar conductor layers and in that (ii) a portion of the stacked via structure other than the opposite ends is located in the resin dielectric layer. Generally speaking, planar conductor layers and stacked via structures are formed of a conductive metal, such as copper, and thus exhibit relatively low coefficient of thermal expansion (e.g., 20 ppm/° C. or less) in a direction perpendicular to the thickness of the multilayer wiring board. In contrast, resin dielectric layers exhibit relatively high coefficient of thermal expansion (e.g., 30 ppm/° C. or more) in a direction perpendicular to the thickness of the multilayer wiring board. Thus, when the multilayer wiring board encounters a thermal shock, the difference in coefficient of thermal expansion between the metal and the resin causes stress forces to be generated in a direction perpendicular to the thickness of the multilayer wiring board. Since the resin dielectric layer expands or contracts to a greater extent than do the planar conductor layers, a bending stress is laterally imposed on the stacked via structure whose opposite ends are supported by the corresponding planar conductor layers. As a result, cracking occurs in a connection between the filled vias. On the basis of these findings, i.e., this inventive appreciation of the underlying problems, the present inventor conducted further extensive studies, and the present invention is based thereon.

In accordance with one aspect of the present invention, there is provided a multilayer wiring board comprising a substrate having a first main surface and a second main surface; a first planar conductor layer disposed, directly or indirectly, on at least either the first main surface or the second main surface; a second planar conductor layer disposed on in spaced relation to the first planar conductor layer; resin dielectric layers interposed between the first planar conductor layer and the second planar conductor layer; filled vias formed in the resin dielectric layers; and a stacked via structure disposed in the resin dielectric layers and comprising a plurality of the filled vias stacked substantially coaxially and mutually connected together. The stacked via structure has a first end and a second end; the first end is connected directly to either the first planar conductor layer or the second planar conductor layer; and the second end is not connected directly to either the first planar conductor layer nor the second planar conductor layer, i.e., is unconnected, directly, to both planar conductor layers.

In accordance with a further aspect of the present invention, there is provided a multilayer wiring board comprising a substrate having a first main surface and a second main surface; a first planar conductor layer disposed, directly or indirectly, on at least either the first main surface or the second main surface; a second planar conductor layer disposed in spaced relation to the first planar conductor layer; resin dielectric layers interposed between the first planar conductor layer and the second planar conductor layer; filled vias formed in the resin dielectric layers; and a stacked via structure disposed in the resin dielectric layers and comprising a plurality of the filled vias stacked substantially coaxially and mutually connected together, the stacked via structure having a first end and a second end, the first end being connected directly to the second planar conductor layer and the second end being located away from the first planar conductor layer.

In the structure employed in an important implementation of the present invention, only the first end of the stacked via structure is connected directly to a planar conductor layer, whereas the second end is not connected directly to a planar conductor layer. The stacked via structure is preferably supported by the planar conductor layer in what can be considered to be a cantilever support. Thus, even when a bending stress is imposed laterally on the stacked via structure, the stacked via structure is less susceptible to the bending stress than in the case where the stacked via structure is supported at opposite ends. Therefore, cracking is less likely to occur in a connection between filled vias of the stacked via structure, and, accordingly a multilayer wiring board having excellent reliability results.

Examples of a substrate that can be used for the substrate which partially constitutes the multilayer wiring board include a resin substrate, a ceramic substrate, and a metallic substrate. From these choices and potentially others, the substrate to be used is selected as appropriate in view of, for example, cost, performance, drilling readiness, and electrical conductivity.

Examples of materials that can be used to form a resin substrate include EP resin (epoxy resin), PI resin (polyimide resin), BT resin (bismaleimide-triazine resin), PPE resin (polyphenylene ether resin), a composite material of such a resin and glass fiber (woven glass fabric or nonwoven glass fabric), a composite material of such a resin and organic fiber, such as polyamide fiber, and a composite resin-resin material formed by impregnating a three-dimensional network fluorine-containing resin base material, such as continuously porous PTFE, with a thermosetting resin, such as an epoxy resin.

Examples of materials that can be used to form a ceramic substrate include alumina, beryllia, aluminum nitride, boron nitride, silicon carbide, and a low-temperature firing material, such as glass-ceramic or crystallized glass.

Examples of metallic substrates include a copper substrate, a copper alloy substrate, a substrate formed of a metal other than copper, and a substrate formed of an alloy other than a copper alloy.

It is noted that the substrate that partially constitutes the multilayer wiring board may, for example, include plated through holes extending therethrough between the first main surface and the second main surface.

The first planar conductor layer, which partially constitutes, i.e., forms part of, the multilayer wiring board, is disposed, directly or indirectly, on at least one of the first main surface or the second main surface. The first planar conductor layer comprises a conductor layer having a relatively large area and corresponds to, for example, one of a land portion or a cover plating portion of the above-mentioned plated though hole, a ground pattern, and a power pattern. It will be understood that no particular limitation is imposed on the area of the first planar conductor layer; however, the effects of the present invention are more clearly appreciable when the area is at least 0.1 mm$^2$ and, more preferably, 0.2 mm$^2$ or more. The reason for this is that an area of 0.1 mm$^2$ or more renders more serious the disadvantages of supporting the stacked via structure at opposite ends, i.e., in the conventional manner, and fosters the tendency toward cracking in a connection between filled vias.

A material, and a method, for forming the first planar conductor layer are selected as appropriate in view of, for example, such factors as electrical conductivity and adhesion with the resin dielectric layer. Examples of metals that can be used to form the first planar conductor layer include copper, a copper alloy, nickel, a nickel alloy, tin, and a tin alloy. Examples of known processes used to form the first planar conductor layer include a subtractive process, a semi-subtractive process, and a full additive process. Specific examples of such processes include copper foil etching, electroless copper plating, copper electroplating, electroless nickel plating, and nickel electroplating. Also, the first planar conductor layer can be formed by the steps of forming a metal layer by, for example, sputtering or CVD, and etching the formed metal layer. Alternatively, the first planar conductor layer can be formed by applying a conductive paste using a printing technique.

Again, although no particular limitation is imposed on the coefficient of thermal expansion of the first planar conductor layer in a direction perpendicular to the thickness board, the effects of the present invention are more clearly appreciable when the coefficient of thermal expansion is 20.0 ppm/° C. or less. The reason for this is that in a case where a large difference in coefficient of thermal expansion in a direction perpendicular to the thickness of the board exists between the first planar conductor layer and the resin dielectric layer (which will be described later), a large bending stress is imposed on the stacked via structure. Consequently, the improvement provided by the present invention becomes more apparent.

It is noted that as used herein, the term "coefficient of thermal expansion" refers to the coefficient of thermal expansion (CTE) in a direction (the X or Y direction) perpendicular to the thickness (the Z direction) of the board and, moreover, to a value measured at a temperature of 0° C. to 200° C. by means of a TMA (a thermomechanical analyzer). The term "TMA" also refers to thermomechanical analysis specified in, for example, JPCA-BU01.

The second planar conductor layer, which partially constitutes, i.e., forms part of, the multilayer wiring board, is disposed in spaced relation to the first planar conductor layer and is spaced therefrom by the resin dielectric layers. More specifically, in the case where the first planar conductor layer is disposed on the first main surface, the second planar conductor layer is disposed on the same side of the substrate, i.e., the first-main-surface side, outwardly of the first planar conductor layer, with a spacing determined by the thickness of the resin dielectric layers. In the case where the first planar conductor layer is disposed on the second main surface, the second planar conductor layer is disposed on the same side, i.e., the second-main-surface side, of the substrate, outwardly of the first planar conductor, with a spacing determined by the thickness of the resin dielectric layers. The second planar conductor layer comprises a conductor layer having a relatively large area and corresponds to, for example, a pad used to mount an electronic component, such as a chip capacitor. Again, while no particular limitation is imposed on the area of the second planar conductor layer, the effects of the present invention are more clearly appreciable when this area is 0.1 mm$^2$ or more, and, more preferably, 0.2 mm$^2$ or more. The reason for this is that an area of 0.1 mm$^2$ or more makes more noticeable the disadvantages of supporting a stacked via structure at opposite ends, and exacerbates or fosters the tendency toward cracking in a connection between filled vias.

A material, and a method, for forming the second planar conductor layer are also selected as appropriate in view of, for example, such factors as electrical conductivity and adhesion with the resin dielectric layer. Examples of metals that can be used to form the second planar conductor layer include copper, a copper alloy, nickel, a nickel alloy, tin, and a tin alloy. Examples of known processes used to form the second planar conductor layer include a subtractive process, a semi-subtractive process, and a full additive process.

Although no particular limitation is imposed on the coefficient of thermal expansion of the second planar conductor layer in a direction perpendicular to the thickness of the board, the effects of the present invention are more clearly appreciable when the coefficient of thermal expansion is 20.0 ppm/° C. or less. The reason for this is that in the case where a large difference in coefficient of thermal expansion in a direction perpendicular to the thickness of the board exists between the second planar conductor layer and the resin dielectric layer (which will be described later), a large bending stress is imposed on the stacked via structure. This stress exacerbates or fosters the tendency toward cracking in a connection between filled vias, a problem which, as indicated above, is combated or overcome by the present invention.

The resin dielectric layers, which partially constitute, i.e., form part of, the multilayer wiring board, intervene between, i.e., are disposed between, the first planar conductor layer and the second planar conductor layer to thereby electrically insulate all the conductor layers from each other. Preferably, at least two resin dielectric layers are laminated on a side of the substrate.

Preferably, each of the resin dielectric layers comprises or is formed of, for example, a thermosetting resin. Examples of suitable thermosetting resins include EP resin (epoxy resin), PI resin (polyimide resin), BT resin (bismaleimide-triazine resin), phenolic resin, xylene resin, polyester resin, and silicon containing resin. Particularly, EP resin, PI resin, and BT resin are more preferred. Preferred types of epoxy resins included resins of the so-called BP (bisphenol) type, PN (phenol novolak) type, and CN (cresol novolak) type. In particular, an epoxy resin that predominantly contains an epoxy resin of a BP type is more preferred. An epoxy resin of a BPA (bisphenol A) type or a BPF (bisphenol F) type is most preferred.

The effects of the present invention are more clearly appreciable when the total thickness of the resin dielectric layers disposed between the first planar conductor layer and the second planar conductor layer is 40 µm or more. Moreover, the effects of the present invention become remarkable when the total thickness of the resin dielectric layers is 60 mm or more, become more remarkable when the total thickness is 90 mm or more, and become most remarkable when the total thickness is 120 mm or more. The reason for this is that a bending stress imposed laterally on the stacked via structure increases with the total thickness of the resin dielectric layers, thereby exacerbating or fostering the tendency toward cracking in a connection between filled vias.

Although no particular limitation is imposed on the coefficient of thermal expansion of the resin dielectric layer in a direction perpendicular to the thickness of the board, the effects of the present invention are more clearly appreciable when the coefficient of thermal expansion is 30.0 ppm/° C. or more, and in particular 40.0 ppm/° C. or more. Further, in view of effective application of the present invention, the difference in coefficient of thermal expansion in a direction perpendicular to the thickness direction of the board between the resin dielectric layer and the first or second planar conductor layer is preferably 10.0 ppm/° C. or more, and more preferably 20.0 ppm/° C. The reasons for this is that when the difference in the coefficient of thermal expansion is large, a large bending stress is imposed on the stacked via structure and, again, thus exacerbates or fosters the tendency toward cracking in a connection between filled vias.

The stacked via structure, which partially constitutes, i.e., forms part of the multilayer wiring board, is preferably of the form of two or more filled vias stacked substantially coaxially and mutually connected together. In one preferred implementation, each of the filled vias is formed in the resin dielectric layer as follows: a through hole is filled with a conductor (typically copper deposited by means of plating) in such a manner that the upper surface of the filled via becomes or is made substantially flat. The bottom surface of another filled via is connected to the substantially flat upper surface of the filled via. Such a filled via is formed by, for example, the steps of forming a through hole in a resin dielectric layer; and performing copper electroplating on the interior of the through hole in such a manner that the upper surface of the filler copper, as finished, is substantially flat. Alternatively, after a through hole is formed in a resin dielectric layer, electroless copper plating is performed on the interior of the through hole, a depression in the thus-formed via is filled with copper deposited by means of copper electroplating or with conductive paste, in such a manner that the upper surface of the filler conductor, as finished, is substantially flat.

Although no particular limitation is imposed on the diameter of the above-mentioned filled via, the effects of the present invention are more clearly appreciable when the diameter is less than 85 mm, and in particular less than 70 mm. The reason for this is that as the diameter of the filled via decreases, the stacked via structure becomes more slender and thus is more susceptible to a lateral bending stress. Again, this exacerbates or fosters the tendency toward cracking in a connection between filled vias. It is noted that, as used herein, the expression "a plurality of the filled vias stacked substantially coaxially" means that the filled vias are stacked in such a manner that any axial misalignment between the filled vias falls within a range of 0 mm to 30 mm.

In accordance with a further aspect of the present invention, there is provided a multilayer wiring board comprising a substrate having a first main surface and a second main surface; a first planar conductor layer disposed, directly or indirectly, on at least one of the first main surface and the second main surface; a second planar conductor layer disposed in spaced relation to the first planar conductor layer; resin dielectric layers interposed between the first planar conductor layer and the second planar conductor layer; filled vias formed in the resin dielectric layers; a stacked via structure disposed in the resin dielectric layers and comprising a plurality of the filled vias stacked substantially coaxially and mutually connected together; and a conformal via formed in one of the resin dielectric layers and having a land portion smaller in area than the first and second planar conductor layers. Further, the stacked via structure has a first end and a second end, the first end is connected directly to the second planar conductor layer, the second end is connected directly to the land portion of the conformal via, and a bottom surface of the conformal via is connected directly to the first planar conductor layer.

In accordance with yet another aspect of the present invention, there is provided a multilayer wiring board comprising a substrate having a first main surface and a second main surface; a first planar conductor layer disposed, directly or indirectly, on at least one of the first main surface and the second main surface; a second planar conductor layer disposed in spaced relation to the first planar conductor layer; resin dielectric layers interposed between the first planar conductor layer and the second planar conductor layer; filled vias formed in the resin dielectric layers; a stacked via structure disposed in the resin dielectric layers and comprising a plurality of the filled vias stacked substantially coaxially and mutually connected together; and a further filled via formed in one of the resin dielectric layers and having a land portion smaller in area than the first and second planar conductor layers. Further, the stacked via structure has a first end and a second end, the first end is connected directly to the second planar conductor layer, the second end is connected directly to the land portion of the further filled via; and a bottom surface of the further filled via is connected directly to the first planar conductor layer.

As described above, according to an important aspect of the present invention, only the first end of the stacked via structure is connected directly to a planar conductor layer, whereas the second end of the stacked via structure is connected indirectly to another planar conductor layer via the aforementioned conformal via or to the aforementioned further filled via. In other words, a direct connection of the second end to the planar conductor layer is avoided, so that the stacked via structure is supported by the planar conductor layer in a cantilever manner. Thus, even when a bending stress is imposed laterally on the stacked via structure, the stacked via structure is less susceptible to this bending stress than would be the case where the stacked via structure is supported at opposite ends, as is conventional. Therefore, cracking becomes less likely to occur in a connection between filled vias of the stacked via structure, and hence a multilayer wiring board incorporating the present invention has excellent reliability.

Further features and advantages of the present invention will be set forth in, or apparent from, the detailed description of preferred embodiments thereof which follows.

BRIEF DESCRIPTION OF THE DRAWINGS

FIG. 7 is a cross-sectional view showing a filled via, in a good mode, used in explanation of the via peeling test;

FIG. 8 is a cross-sectional view showing a filled via, in failure mode, used in explanation of the via peeling test;

FIG. 9 is a table showing the results of a via peeling test conducted on an example and a comparative example.

DESCRIPTION OF THE PREFERRED EMBODIMENTS

A "build-up" multilayer wiring board, generally denoted 11, as constructed according to one embodiment of the present invention, will now be described in detail with reference to FIGS. 1 to 9.

Figure 1:
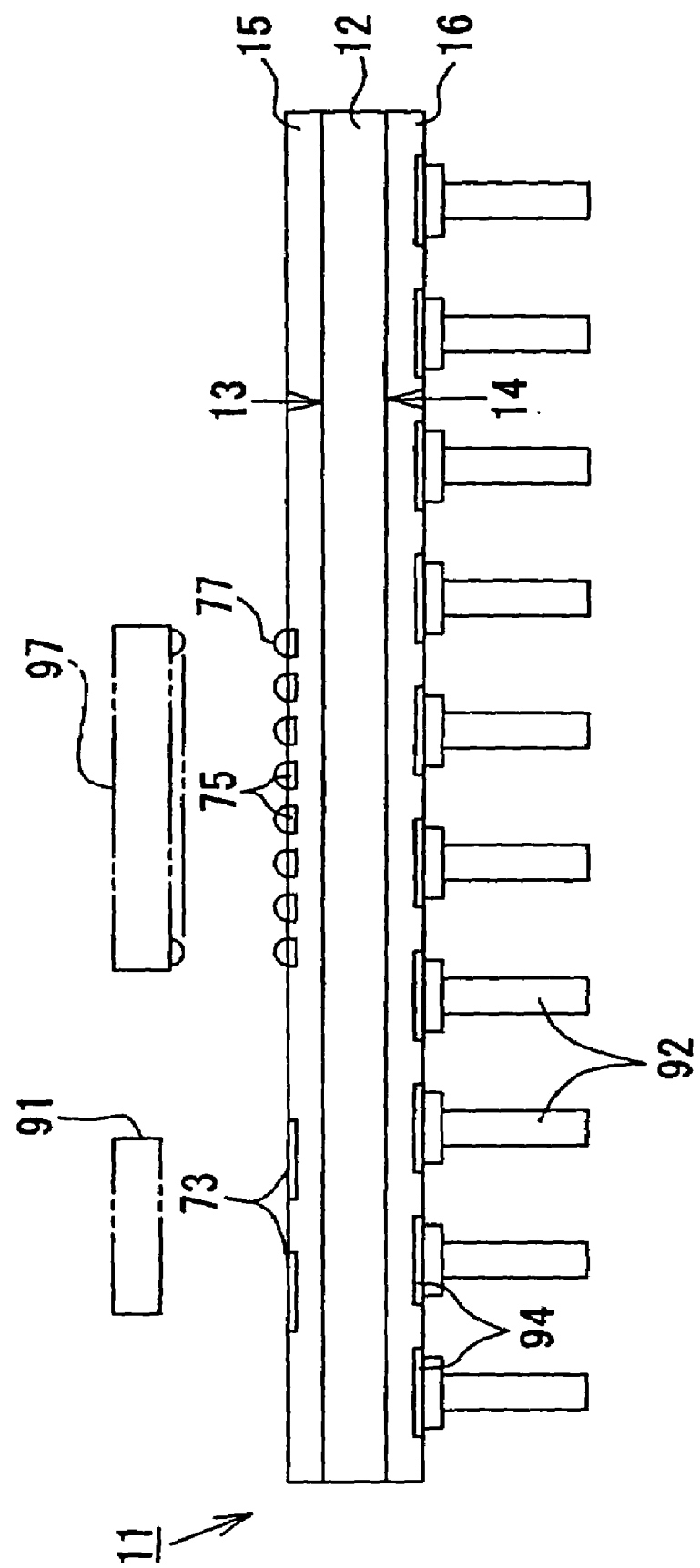
FIG. 1 is a general schematic side elevational view of a multilayer wiring board according to one embodiment of the present invention.
Figure 2:
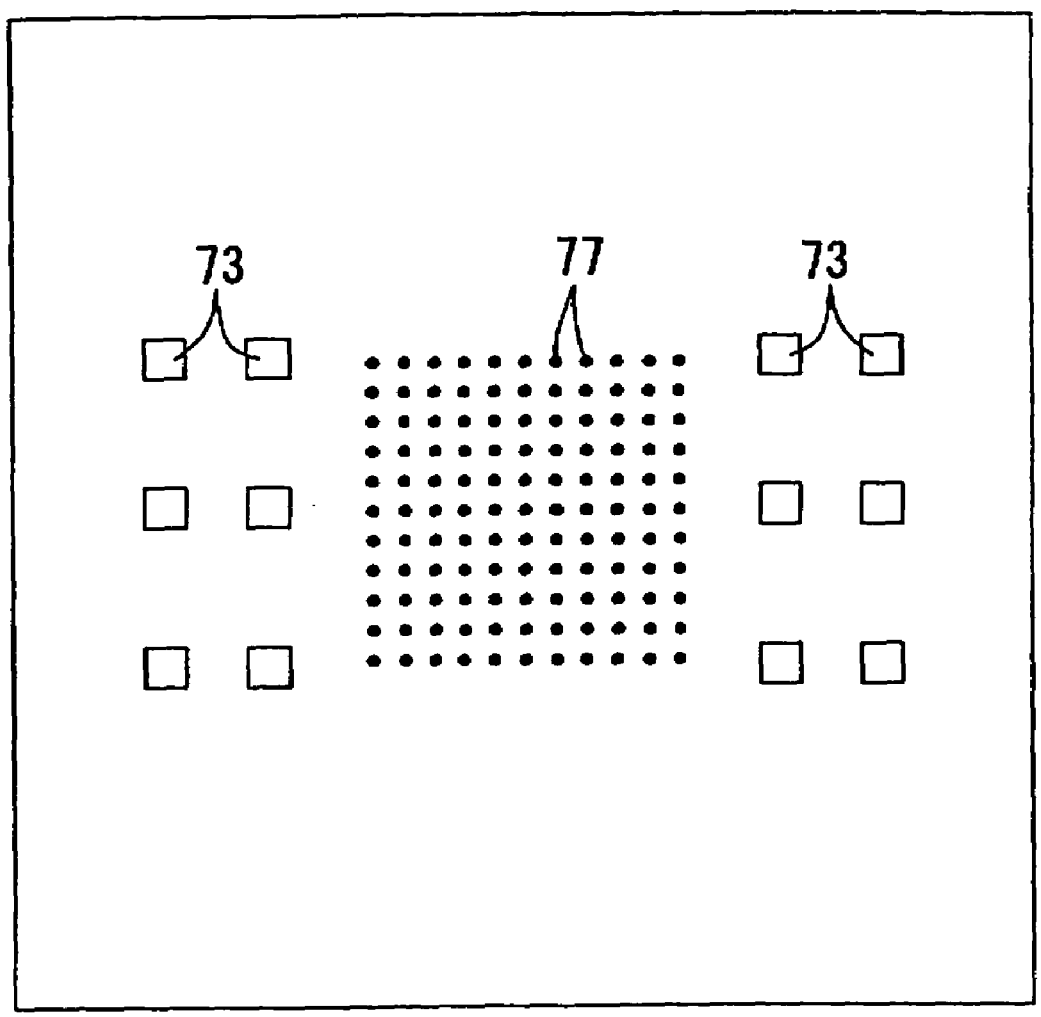
FIG. 2 is a schematic plan view of the multilayer wiring board of the embodiment of FIG. 1.
Figure 3:
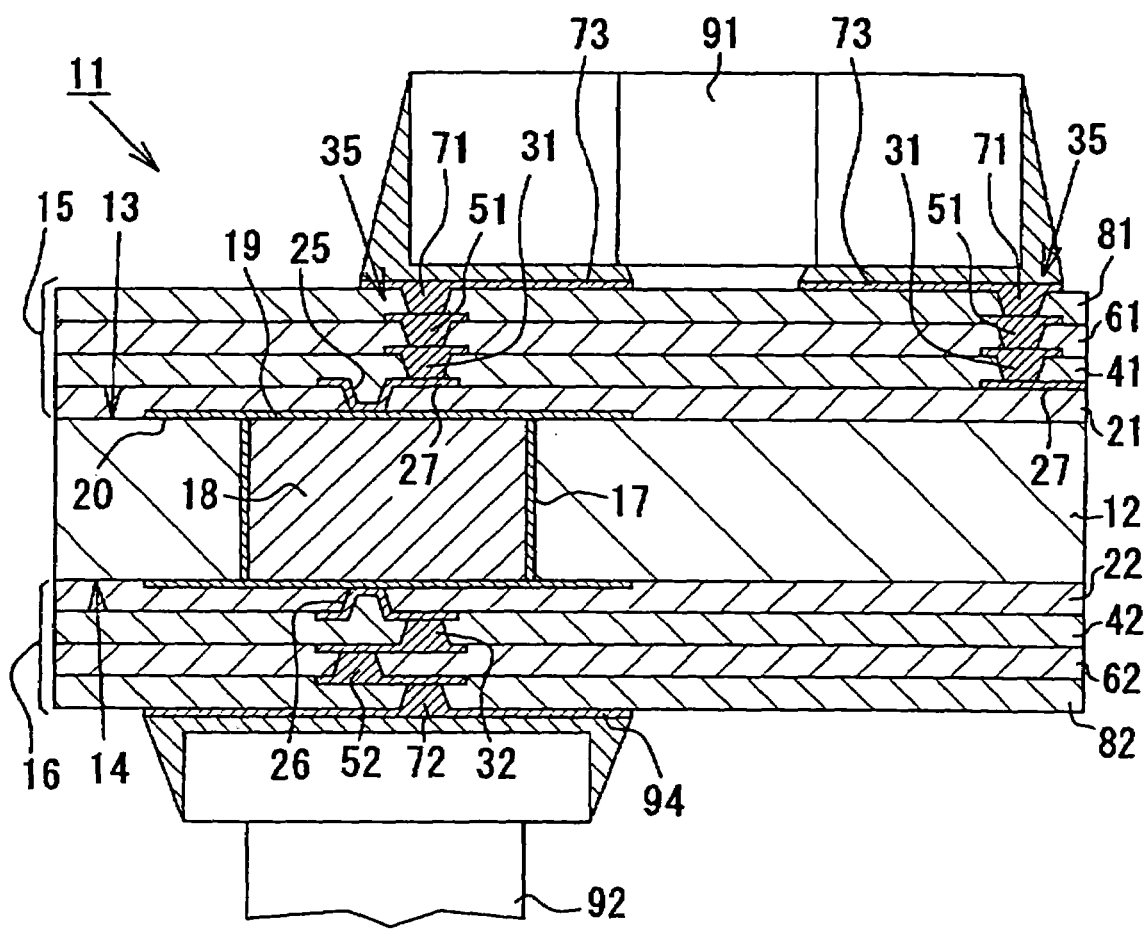
FIG. 3 is an enlarged schematic cross-sectional view showing, drawn to an enlarged scale, portions of the multilayer wiring board of the embodiment of FIG. 1.

As shown in FIGS. 1 to 3, the multilayer wiring board 11 of this embodiment includes, in this implementation, a substantially rectangular substrate 12 as a core or base material. In a specific non-limiting implementation, the substrate 12 is formed of BT resin and has a thickness of about 600 μm to 800 μm. As shown in FIG. 3, an upper "build-up" layer 15 is formed on an upper surface (i.e., a first main surface) 13 of the substrate 12, and a lower "build-up" layer 16 is formed on a lower surface (i.e., a second main surface) 14 of the substrate 12. A number of plated through holes 17, typically having a diameter of about 200 μm to 300 μm, are formed in the substrate 12 at predetermined positions in such a manner as to extend through the substrate 12 between the upper surface 13 and the lower surface 14. A cavity in each of the plated through holes 17 is filled, preferably with an epoxy resin that contains a copper filler, thereby forming a resin filler body 18. A metal, preferably copper, plating is applied to the opposite end portions or regions of the plated through hole 17, thereby forming a cover plating portion 19 that covers the resin filler body 18. In the present embodiment depicted in FIG. 3, a land portion 20 and the cover plating portion 19 of the plated through hole 17 are formed flush with each other and constitute a first planar conductor layer of a relatively large area (typically 0.1 mm² or more).

The upper build-up layer 15 is configured such that resin dielectric layers, indicated at 21, 41, 61, 81, and corresponding unillustrated conductor layers are arranged in alternating dielectric and conductor layers. Similarly, the lower build-up layer 16 is configured such that resin dielectric layers 22, 42, 62, and 82 and unillustrated conductor layers are arranged in alternating dielectric and conductor layers.

A first conductor layer is formed on each of the upper and lower surfaces 13 and 14 of the substrate 12. In a preferred embodiment, the first conductor layer has a thickness of about 35 mm and is formed from a copper foil affixed to the substrate 12, which serves as a core material. The aforementioned land portion 20 and the cover plating portion 19, which constitute a first planar conductor layer, form part of the first conductor layer.

The first resin dielectric layers 21 and 22 of respective build-up layers 15 and 16, have a thickness of 20 μm or 30 μm and in one implementation, are formed of an epoxy resin that contains an inorganic filler. The first resin dielectric layer 21, which is located on the upper surface 13 of the substrate 12, is formed in such a manner as to cover the aforementioned first conductor layer including land portion 20 and cover plating portion 19. The first resin dielectric layer 22, which is located on the lower surface 14 of the substrate 12, is formed in such a manner as to cover the first conductor layer including portions corresponding to portions 20 and 19.

A second conductor layer (not shown) of the aforementioned unillustrated conductor layers, having, in one implementation, a thickness of about 15 mm is formed, preferably from copper, on each of the first resin dielectric layers 21 and 22. The second resin dielectric layers 41 and 42 of respective build-up layers 15 and 16, each typically having a thickness of 30 μm, are formed from a photosensitive epoxy resin on the corresponding second conductor layers.

A third of the aforementioned conductor layers (not shown), typically having a thickness of about 15 μm, is formed, preferably from copper, on each of the second resin dielectric layers 41 and 42.

The third resin dielectric layers 61 and 62 of respective build-up layers, each typically having a thickness of 30 μm, are formed from a photosensitive epoxy resin on the corresponding third conductor layers.

A fourth conductor layers (not shown) of the aforementioned unillustrated conductor layers, typically having a thickness of about 15 μm, is formed, preferably from copper, on each of the third resin dielectric layers 61 and 62.

The fourth resin dielectric layers 81 and 82 of the respective build-up layers 15 and 16, each typically having a thickness of 30 μm, are formed from a photosensitive epoxy resin on the corresponding fourth conductor layers.

Pads 73 and 75 (which form a fifth conductor layer), each typically having a thickness of about 15 μm, are formed, preferably from copper, on the fourth resin dielectric layer 81, and pads 94 (constituting a fifth conductor layer), each typically having a thickness of about 15 μm, are formed from copper on the fourth resin dielectric layer 82. Solder resist (not shown) is applied to the pads 73, 75, and 94.

Referring to FIGS. 1 and 2, a number of the pads 75 are to be flip-chip-bonded to an IC chip 97 and are latticed on the upper surface 13 side of the substrate 12, at a substantially central portion of the multilayer wiring board 11. The pads 73, which serve as a second planar conductor layer, are used to mount a chip capacitor 91 and are arranged on the upper surface side 13 of the substrate 12 around the pads 75 (see FIGS. 1 and 2). The pads 94 are used to attach corresponding terminal pins 92 and are arranged on the lower surface 14 side of the substrate 12 over substantially the entire region of the multilayer wiring board 11. In one preferred implementation, each of the pads 73 used to mount a chip capacitor has a rectangular shape measuring 0.3 mm×0.7 mm and an area of about 0.21 mm².

As shown in FIG. 3, conformal vias 25 and 26, i.e., vias that, inter alia, are not completely filled with copper plating and thus, inter alia, comprise, as shown, conductor (copper plate) members having a recess therein filled with the resin of the corresponding resin dielectric layer, are formed in the first resin dielectric layers 21 and 22, respectively, preferably by means of copper electroplating. The conformal vias 25 and 26 are not constituents of, i.e., do not form part of, a stacked via structure 35, which will be described later. First filled vias 31 and 32 are formed in the respective second resin dielectric layers 41 and 42, preferably by means of copper electroplating. Second filled vias 51 and 52 are formed in the respective third resin dielectric layers 61 and 62, preferably by means of copper electroplating. Third filled vias 71 and 72 are formed in the respective fourth resin dielectric layers 81 and 82, preferably by means of copper electroplating. It is noted that the first filled vias 31 and 32, the second filled vias 51 and 52, and the third filled vias 71 and 72 preferably have a diameter of about 69 mm.

Figure 4:
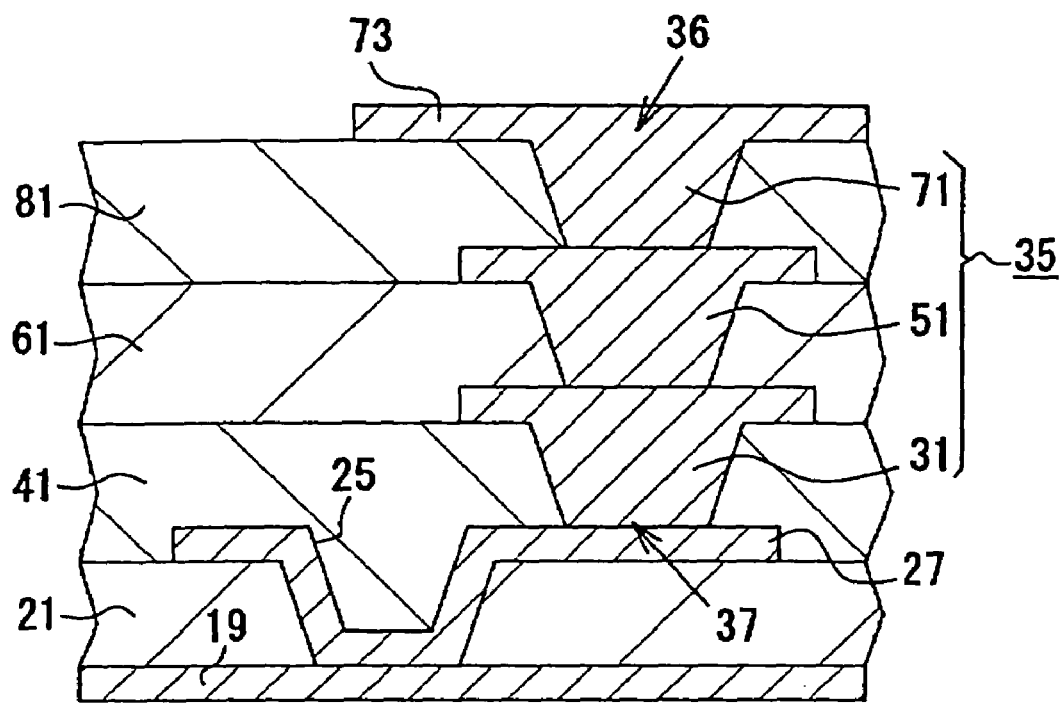
FIG. 4 is an enlarged schematic cross-sectional view showing a stacked via structure in the multilayer wiring board of the embodiment of FIG. 1.
Figure 5:
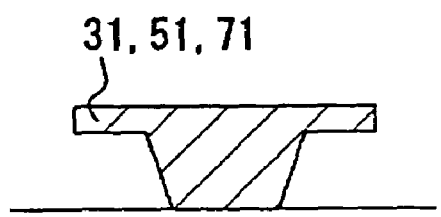
FIG. 5 is a cross-sectional view showing a filled via, as viewed after removal of a resin dielectric layer, used in explanation of a via peeling test conducted on the multilayer wiring board of the embodiment of FIG. 1.

As shown in FIGS. 3 and 4, in the upper build-up layer 15, the first filled via 31, the second filled via 51, and the third filled via 71 are stacked substantially coaxially and are mutually connected. As a result, a three-layer stacked via structure 35 is formed in the upper build-up layer 15. In the lower build-up layer 16, the first filled via 32, the second filled via 52, and the third filled via 72 are mutually connected, but are not stacked in a substantially coaxial manner. Therefore, a stacked via structure corresponding to via structure 35 is not formed in the lower build-up layer 16.

As shown in FIG. 4, a first end or outer end 36 of the stacked via structure 35, i.e., the upper surface of the third filled via 71, is connected directly to the pad 73 used to mount a chip capacitor, i.e., to the second planar conductor layer. In contrast, a second end or inner end 37 of the stacked via structure 35, i.e., the bottom surface of the first filled via 31, is not connected directly to the first planar conductor layer, which, as indicated above, is constituted by the land portion 20 and the cover plating portion 19. In other words, the second end 37 of via structure, i.e., the bottom surface of the first filled via 31, is located away from, i.e., offset from, the first planar conductor layer and is connected to a land portion 27 of the conformal via 25. Therefore, in the present embodiment under consideration, the second end 37 of the stacked via structure 35 can be said to be connected indirectly to the first planar conductor layer via the conformal via 25. It is noted that the conformal via 25 is not coaxial with the first, second, and third filled vias 31, 51, and 71, which constitute the stacked via structure 35. The area of the land portion 27 of the conformal via 25 is considerably smaller than 0.1 mm²; and, as stated, the land portion 27 does not correspond to or form part of the first planar conductor layer and the second planar conductor layer mentioned above.

In the present embodiment, the coefficient of thermal expansion of the first and second planar conductor layers, in a direction perpendicular to the thickness of the board, is typically about 17.0 ppm/° C. In contrast, the coefficient of thermal expansion of the resin dielectric layers 21, 41, 61, and 81 in a direction perpendicular to the thickness direction of the board, is typically about 55.0 ppm/° C. Therefore, the difference in coefficient of thermal expansion between the planar conductor layers and resin layers is about 38.0 ppm/° C.

Next, one method or procedure for manufacturing the thus-configured multilayer wiring board 11 will be described.

In a preferred implementation of this method, as a first step, a double-sided copper-clad substrate is prepared. The double-sided copper-clad substrate is formed by affixing copper foil onto the opposite sides of a substrate. Through holes are formed in the double-sided copper-clad substrate at predetermined positions by a laser drilling process that uses YAG laser or carbon dioxide gas laser. The plated through holes, denoted 17 in FIG. 3, are formed by performing electroless copper plating and copper electroplating in accordance with respectively known processes. Subsequently, the plated through holes 17 are filled with the respective resin filler bodies 18. Furthermore, copper plating is performed so as to form the respective cover plating portions 19 for the plated through holes 17. The copper foil affixed to the opposite sides of the substrate is subjected to etching to thereby form the first conductor layer in a predetermined pattern. Specifically, after electroless copper plating is performed, exposure and development are performed so as to form plating resist in a predetermined pattern. In this state, copper electroplating is performed while the electroless copper plating layer is used as a common electrode. Next, the resist is dissolved and removed. Unnecessary portions of the electroless copper plating layer are then etched away.

Next, referring again to FIG. 3 which shows the finished device, a photosensitive epoxy resin is applied to the upper surface 13 and the lower surface 14 of the substrate 12, followed by exposure and development to thereby form the first resin dielectric layers 21 and 22 in which blind holes are formed where the conformal vias 25 and 26 are to be formed. Copper electroplating is then performed in accordance with a known process (e.g., a semi-additive process), thereby forming the blind holes into the conformal vias 25 and 26 and forming the second conductor layer on each of the first resin dielectric layers 21 and 22.

Next, a photosensitive epoxy resin is applied to the first resin dielectric layers 21 and 22, followed by exposure and development thereof to thereby form the second resin dielectric layers 41 and 42 in which blind holes are formed at locations where the first filled vias 31 and 32 are to be formed. Then, copper electroplating is carried out in accordance with a known process, thereby converting the blind holes into the first filled vias 31 and 32 and forming the third conductor layer on each of the second resin dielectric layers 41 and 42.

In a subsequent step, a photosensitive epoxy resin is applied to the second resin dielectric layers 41 and 42, followed by exposure and development thereof to thereby form the third resin dielectric layers 61 and 62 in which blind holes are formed at locations where the second filled vias 51 and 52 are to be formed. Thereafter, copper electroplating is performed in accordance with a known process, thereby converting the blind holes into the second filled vias 51 and 52 and forming the fourth conductor layer on each of the third resin dielectric layers 61 and 62.

Next, a photosensitive epoxy resin is applied to the third resin dielectric layers 61 and 62, followed by exposure and development thereof to thereby form the fourth resin dielectric layers 81 and 82 in which holes are formed at locations where the third filled vias 71 and 72 are to be formed. Then, copper electroplating is performed in accordance with a known process, thereby forming the holes into the third filled vias 71 and 72 and forming the pads 73 and 75 (the fifth conductor layer) on the fourth resin dielectric layer 81, and the pads 94 (the fifth conductor layer) on the fourth resin dielectric layer 82. When this stage is completed, the stacked via structure 35 of the present embodiment is formed which is composed of the first filled via 31, the second filled via 51, and the third filled via 71.

Subsequently, after solder resist is applied, the pads 73, 75, and 94 are sequentially subjected to electroless nickel plating and electroless gold plating. Furthermore, solder bumps 77 are formed on the corresponding pads 75 used for flip-chip bonding. In addition, the terminal pins 92 are soldered to the corresponding pads 94. As a result, the desired multilayer wiring board 11 having the build-up layers 15 and 16 formed on its corresponding opposite sides is completed. When the IC chip 97, the chip capacitor 91, and other components are mounted on the multilayer wiring board 11, an organic package is completed.

Next will be described a specific method providing a via peeling test that was conducted on the above-described multilayer wiring board 11, as well as the test results produced by this testing.

Figure 6:
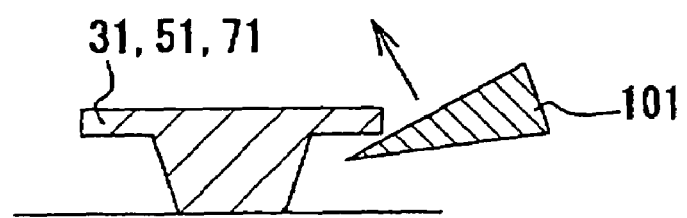
FIG. 6 is a cross-sectional view showing, schematically, the filled via and a peeling jig used in explanation of the via peeling test.

The via peeling test was conducted as follows. First, a thermal shock ranging from −55° C. to 125° C. was imposed 100 times on the multilayer wiring board 11. Subsequently, the resin dielectric layers 21, 41, 61, and 81 surrounding the filled vias 31, 51, and 71 were removed by means of, for example, RIE (reactive ion etching) (see FIG. 5). Next, as shown in FIG. 6, using a peeling jig 101, a land portion of each of the filled vias 31, 51, and 71 was lifted upward from underneath. FIG. 7 shows a first mode, a good mode, in which, as is desirable, the land portion was cracked and broken before the bottom of the via was cracked. FIG. 8 shows a second mode, a failure mode, in which the via bottom was cracked and exfoliated, i.e., separated from its base support, before the land portion was cracked and broken.

As discussed above, the stacked via structure 35 is configured, as shown in FIG. 4, such that the first end 36 is connected directly to the second planar conductor layer while the second end 37 is not connected directly to the first planar conductor layer. This configuration was taken as a sample serving as an "Example" of a stacked via structure in accordance with the present embodiment. In contrast, a stacked via structure configured such that the first end 36 is connected directly to the second planar conductor layer while the second end 37 is connected directly to the first planar conductor layer was taken as a sample serving as a "Comparative Example" of a conventional stacked via structure.

A via peeling test was conducted, using the above-described method, on these two kinds of samples at three portions thereof (i.e., at the first filled via 31, at the second filled via 51, and at the third filled via 71). The samples were examined for the occurrence of cracking in the first, second, and third filled vias 31, 51, and 71, i.e., examined as to the number of failure mode occurrences. 1,600 samples were tested for each of Example and Comparative Example. The test results are shown in the table of FIG. 9.

As shown in the table of FIG. 9, in the samples of the Example, all of the first, second, and third filled vias 31, 51, and 71 exhibited the characteristic of the good mode, i.e., the failure mode did not occur. In contrast, in the samples of the Comparative Example, only with the third filled vias 71, did the failure mode not occur, and the failure mode occurred with a significant number of the first and second filled vias 31 and 51. Moreover, the failure mode tended to occur at a higher rate with the first filled vias 31 than with the second filled vias 51. As is apparent from the test results, the stacked via structure 35 of the present embodiment exhibit excellent reliability as compared with conventional stacked via structures.

Considering the reasons for this improvement in reliability, in the present embodiment, only the first end 36 of the stacked via structure 35 is connected directly to the pad 73, which serves as the second planar conductor layer, whereas the second end 37 is not connected directly to the first planar conductor. In other words, the stacked via structure 35 is supported by the second planar conductor layer in what can be thought of as a cantilever manner. Thus, even when a bending stress is imposed laterally on the stacked via structure 35, the stacked via structure 35 is less susceptible to this bending stress than would be the case where a stacked via structure is supported at opposite ends by the first and second planar conductor layers. Therefore, cracking is less likely to occur in the connection between the first via 31 and the land portion 27 of the conformal via 25, in the connection between the first filled via 31 and the second filled via 51, and in the connection between the second filled via 51 and the third filled via 71. Therefore, as indicated above, in contrast to a conventional multilayer wiring board, the multilayer wiring board 11 exhibits excellent reliability.

It will, of course, be understood that the present invention is not limited to the above-described embodiment, but may be modified as appropriate without departing from the scope of the invention.

Considering some examples of such modifications, the above embodiment is described in relation to the stacked via structure 35 in which three filled vias are stacked. However, the present invention may be applied to a stacked via structure in which four, five, six, or more filled vias are stacked.

In the above described embodiment, the second end 37 of the stacked via structure 35 is connected directly to the land portion 27 of the conformal via 25 so as to thereby be located away from the first planar conductor layer. The present invention is not limited to such a construction and for example, the second end 37 may be connected directly to a conductor portion having a relatively small area of the conformal via 25, other than the land portion 27.

Figure 10:
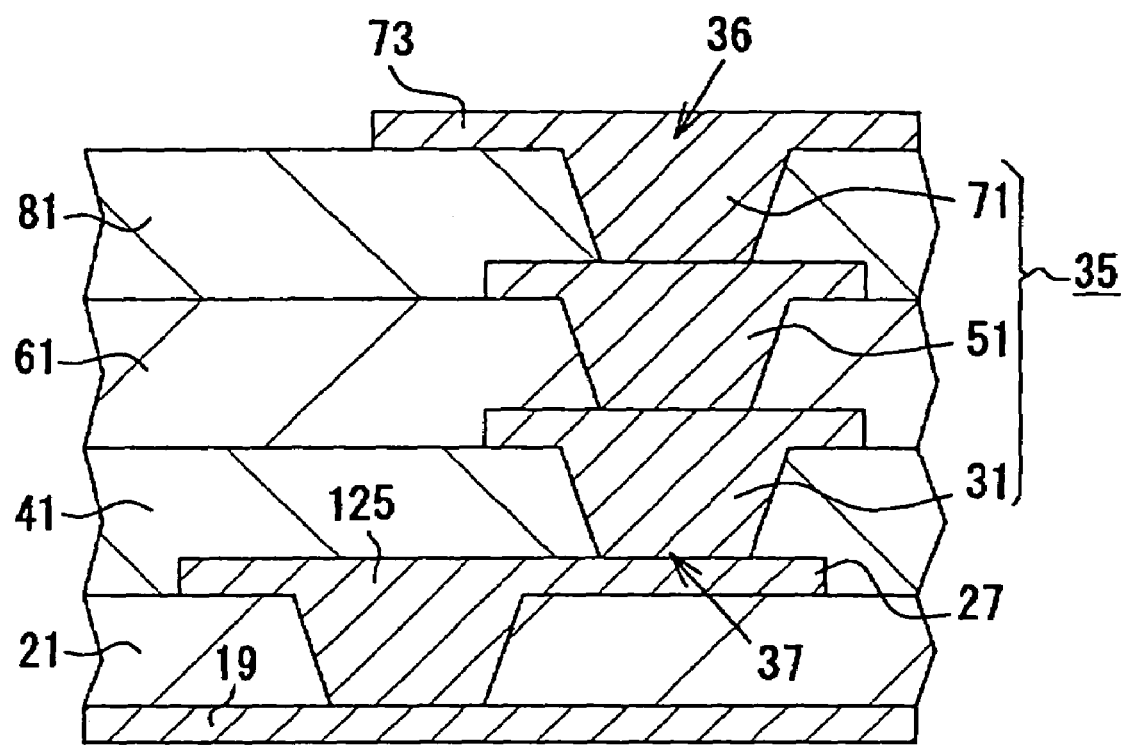
FIG. 10 is an enlarged schematic cross-sectional view showing portions of a multilayer wiring board according to another embodiment of the present invention.

Further, in the above embodiment, the second end 37 of the stacked via structure 35 is connected to the conformal via 25. However, as shown in FIG. 10, the second end 37 may be connected to a further filled via wherein a direct connection is avoided, i.e., a via 125, which is not a constituent of the stacked via structure 35. However, in this case, as in the case of the above embodiment, the stacked via structure 35 and the further "direct-connection-avoidance" filled via 125 must be arranged so as not to be coaxial with each other. In FIG. 10, the second end 37 of the stacked via structure 35 is connected directly to a land portion 27 of the further filled via 125, thereby avoiding a direct connection between the second end 37 and the cover plating portion 19. As illustrated in FIG. 10, land 27 extends outwardly of the main portion of filled via 125 an amount such that, and is of an area such that, the second end 37 of the stacked via structure 35 is connected to the land 27 completely outboard of, i.e., completely outwardly of, the main portion of filled via 125. It will be appreciated that the conformal via 26 located on the lower surface 14 side of the substrate 12 may also be modified in a manner similar to the further "direct-connection-avoidance" filled via 125.

Some technological ideas that are implemented by the above-described embodiments include those enumerated below.

One idea concerns the provision of a multilayer wiring board which includes a substrate having a first main surface and a second main surface; a first planar conductor layer disposed, directly or indirectly, on at least either the first main surface or the second main surface; a second planar conductor layer disposed in spaced relation to the first planar conductor layer; resin dielectric layers interposed between the first planar conductor layer and the second planar conductor layer; filled vias formed in the resin dielectric layers; a stacked via structure disposed in the resin dielectric layers and comprising a plurality of the filled vias stacked substantially coaxially and mutually connected together; and a further via formed in the resin dielectric layer, said further via having a land portion of a smaller area than the first and second planar conductor layers, and not being a constituent of the stacked via structure. In the multilayer wiring board, the stacked via structure has a first end and a second end; the first end is connected directly to the second planar conductor layer; the second end is directly connected to the land portion of the via that is not a constituent of the stacked via structure; and a bottom surface of the via that is not a constituent of the stacked via structure is connected directly to the first planar conductor layer.

Preferably, in the multilayer wiring board described in the preceding paragraph, the diameter of the filled via is less than 85 mm.

Advantageously, in the multilayer wiring board described above in either of the previous paragraphs, the second planar conductor layer is a pad used to mount a chip capacitor.

Preferably, in the multilayer wiring board described above in any one of the preceding paragraphs, the first planar conductor layer and the second planar conductor layer have an area of at least 0.1 mm².

Advantageously, in the multilayer wiring board described above in any one of the prior paragraphs, the total thickness of the resin dielectric layers interposed between the first planar conductor layer and the second planar conductor layer is at least 60 μm.

Preferably, in the multilayer wiring board described above in any one of the previous paragraphs, the first and second planar conductor layers have a coefficient of thermal expansion of no greater than 20.0 ppm/° C. in a direction perpendicular to the thickness of the board, and the resin dielectric layer has a coefficient of thermal expansion of at least 30.0 ppm/° C. in a direction perpendicular to the thickness of the board.

Again, although the invention has been described above in relation to preferred embodiments thereof, it will be understood by those skilled in the art that variations and modifications can be effected in these preferred embodiments without departing from the scope and spirit of the invention.

What is claimed is:

1. A multilayer wiring board comprising:
a substrate having a first main surface and a second main surface;
a first planar conductor layer disposed, directly or indirectly, on at least one of the first main surface and the second main surface;
a second planar conductor layer disposed in spaced relation to the first planar conductor layer;
a plurality of resin dielectric layers interposed between the first planar conductor layer and the second planar conductor layer;
filled vias formed in the resin dielectric layers; and
a stacked via structure disposed in the resin dielectric layers and comprising a plurality of the filled vias stacked substantially coaxially and mutually connected together;
the stacked via structure having a first end and a second end; the first end being directly connected to either the first planar conductor layer or the second planar conductor layer; and the second end being connected to the first planar conductor layer or, to the second planar conductor layer by a conformal via less than completely filled with conductor material including a side wall portion and a connector portion bridging the side wall portion at said second end of the stacked via structure, said side wall portion and said connector portion being of a common uniform thickness and said connector portion being connected to the first planar conductor layer or the second planar conductor layer.

2. A multilayer wiring board comprising:
a substrate having a first main surface and a second main surface;
a first planar conductor layer disposed, directly or indirectly, on at least one of the first main surface and the second main surface;
a second planar conductor layer disposed in spaced relation to the first planar conductor layer;
resin dielectric layers interposed between the first planar conductor layer and the second planar conductor layer;
filled vias formed in the resin dielectric layers; and
a stacked via structure disposed in the resin dielectric layers and comprising a plurality of the filled vias stacked substantially coaxially and mutually connected together;
the stacked via structure having a first end and a second end; the first end being connected directly to the second planar conductor layer; and the second end being connected to the first planar conductor layer by a conformal via comprising a conductor member having a recess therein filled by resin of one of said resin dielectric layers, said conductor member including a side wall portion and a connector portion bridging the side wall portion at said second end of the stacked via structure, said side wall portion and said connector portion being of a common uniform thickness and said connector portion being connected to the first planar conductor layer or the second planar conductor layer.

3. A multilayer wiring board comprising:
a substrate having a first main surface and a second main surface;
a first planar conductor layer disposed, directly or indirectly, on at least one of the first main surface and the second main surface;
a second planar conductor layer disposed in spaced relation to the first planar conductor layer;
resin dielectric layers interposed between the first planar conductor layer and the second planar conductor layer;
filled vias formed in the resin dielectric layers;
a stacked via structure disposed in the resin dielectric layers and comprising a plurality of the filled vias stacked substantially coaxially and mutually connected together; and
a conformal via formed in one of the resin dielectric layers and having a land portion smaller in area than the first and second planar conductor layers, said conformal via being less than completely filled with conductor material;

the stacked via structure having a first end and a second end; the first end being connected directly to the second planar conductor layer; the second end being connected directly to the land portion of the conformal via; and a bottom surface of the conformal via being connected directly to the first planar conductor layer and said conductor member including a side wall portion and a connector portion bridging the side wall portion at said second end of the stacked via structure, said side wall portion and said connector portion being of a common uniform thickness and said connector portion being connected to the first planar conductor layer or the second planar conductor layer.

* * * * *